USO05563595A

United States Patent [19]

Strohacker

[11] Patent Number: 5,563,595
[45] Date of Patent: Oct. 8, 1996

[54] METHOD AND APPARATUS FOR COMPRESSING DATA

[75] Inventor: Oscar C. Strohacker, Dripping Springs, Tex.

[73] Assignee: International Business Machines Corporation, Armonk, N.Y.

[21] Appl. No.: 173,738

[22] Filed: Dec. 23, 1993

[51] Int. Cl.$^6$ .............................. H03M 7/30; H03M 7/40
[52] U.S. Cl. ................................................ 341/106; 341/51
[58] Field of Search .............................. 341/50, 51, 106, 341/87, 95

[56] References Cited

U.S. PATENT DOCUMENTS

| | | |
|---|---|---|
| 3,914,586 | 10/1975 | McIntosh . |
| 4,021,782 | 5/1977 | Hoerning . |
| 4,054,951 | 10/1977 | Jackson et al. . |
| 4,087,788 | 5/1978 | Johannesson . |
| 4,286,256 | 8/1981 | Langdon, Jr. et al. . |
| 4,295,125 | 10/1981 | Langdon, Jr. . |
| 4,321,668 | 3/1982 | Flynn et al. . |
| 4,463,342 | 7/1984 | Langdon, Jr. et al. . |
| 4,464,650 | 8/1984 | Eastman et al. . |
| 4,467,317 | 8/1984 | Langdon, Jr. et al. . |
| 4,558,302 | 12/1985 | Welch . |
| 4,560,976 | 12/1985 | Finn . |
| 4,586,027 | 4/1986 | Tsukiyama et al. . |
| 4,612,532 | 9/1986 | Bacon et al. . |
| 4,622,545 | 11/1986 | Atkinson . |
| 4,622,585 | 11/1986 | Reitsma . |
| 4,633,490 | 12/1986 | Goertzel et al. . |
| 4,652,856 | 3/1987 | Mohiuddin et al. . |
| 4,667,649 | 5/1987 | Humphrey . |
| 4,677,649 | 6/1987 | Kunishi et al. . |
| 4,682,150 | 7/1987 | Mathes et al. . |

(List continued on next page.)

FOREIGN PATENT DOCUMENTS

| | | |
|---|---|---|
| 0380294A1 | 8/1990 | European Pat. Off. . |
| 3-247123 | 11/1991 | Japan . |

OTHER PUBLICATIONS

*Springer–Verlag Berlin Heidelberg*, Teuvo Kohonen, "Content–Addressable Memories", New York, 1980, pp. 1–9, 125–146, 191–210, and 268–271.

*Journal of the Association for Computing Machinery*, "Data Compression via Textual Substitution", J. A. Storer et al vol. 29, Oct. 1982, pp. 926–951.

*Advanced Hardware Architectures Product Brief*, "AHA3101 Data Compression Coprocessor IC".

*Stac Electronics Patent Pending*, "9704 Data Compression Coprocessor", PRS0006 Revision 1.01 (Feb. 1990).

*Quarter–Inch Cartridge Drive Standards, Inc. Development Standard*, "DCLZ Data Compression Format", QIC–130 Revision A, Apr. 16, 1991.

*Journal of the Association for Computing Machinery*, "Linear Algorithm for Data Compression via String Matching", S. Even et al, vol. 28, No., Jan. 1981, pp. 16–24.

*IEEE Transactions on Information Theory*, "Compression of Individual Sequences Via Variable–Rate Coding", J. Siv and A. Lempel, vol. IT–24, No. 5, Sep. 1978, pp. 530–536. 926–951.

*IEEE Transaction on Information Theory*, "A Universal Algorithm for Sequential Data Compression", J. Ziv and A Lempel, vol. IT–23, No. 3, May 1977, pp. 337–343.

(List continued on next page.)

*Primary Examiner*—Jeffrey A. Gaffin
*Assistant Examiner*—Peguy JeanPierre
*Attorney, Agent, or Firm*—Paul S. Drake; Volel Emile

[57] ABSTRACT

An apparatus for compressing data including apparatus for using a received data element as an address to a location in a memory, an apparatus for determining whether the addressed memory location contains a first record of a first matching data element, and an apparatus for generating a pointer to the first matching data element. In addition, a method for compressing data including the steps of using a received data element as an address to a location in a memory, determining whether the addressed memory location contains a first record of a first matching data element, and generating a pointer to the first matching data element.

20 Claims, 9 Drawing Sheets

U.S. PATENT DOCUMENTS

| | | |
|---|---|---|
| 4,701,745 | 10/1987 | Waterworth . |
| 4,730,348 | 3/1988 | MacCrisken . |
| 4,814,746 | 3/1989 | Miller et al. . |
| 4,853,696 | 8/1989 | Mukherjee . |
| 4,872,009 | 10/1989 | Tsukiyama et al. . |
| 4,876,541 | 10/1989 | Storer . |
| 4,891,643 | 1/1990 | Mitchell et al. . |
| 4,891,784 | 1/1990 | Kato et al. . |
| 4,899,147 | 2/1990 | Schiavo et al. . |
| 4,905,297 | 2/1990 | Langdon, Jr. et al. . |
| 4,906,991 | 3/1990 | Fiala et al. . |
| 4,935,882 | 2/1990 | Pennebaker et al. . |
| 4,943,869 | 7/1990 | Horikawa et al. . |
| 4,955,066 | 9/1990 | Notenboom . |
| 4,973,961 | 11/1990 | Chamzas et al. . |
| 4,988,998 | 1/1991 | O'Brien . |
| 5,001,478 | 3/1991 | Nagy . |
| 5,003,307 | 3/1991 | Whiting et al. . |
| 5,016,009 | 5/1991 | Whiting et al. . |
| 5,023,611 | 1/1991 | Chamzas et al. . |
| 5,025,258 | 1/1991 | Duttweiler . |
| 5,049,881 | 9/1991 | Gibson et al. . |
| 5,051,745 | 9/1991 | Katz . |
| 5,109,433 | 4/1992 | Notenboom . |
| 5,130,993 | 7/1992 | Gutman et al. . |
| 5,140,321 | 8/1992 | Jung . |
| 5,150,430 | 9/1992 | Chu . |
| 5,155,484 | 10/1992 | Chambers, IV . |
| 5,245,614 | 9/1993 | Gutman et al. . |
| 5,293,379 | 3/1994 | Carr . |
| 5,329,405 | 7/1994 | Hou et al. . |
| 5,404,308 | 4/1995 | Kim et al. ................................ 341/67 |
| 5,406,279 | 4/1995 | Anderson et al. ........................ 341/51 |

OTHER PUBLICATIONS

*USENIX Conference Proceedings*, "Compressed Executables: An Exercise in Thinking Small", M. Taunton, Jun. 10–14, 1991, pp. 385–403.

*Infochips Systems, Inc. Preliminary Product Specifications*, "IC–105 Compression Decompression Processor".

*Infochips Systems, Inc. Preliminary Product Specifications*, "HA–105 SCSI Data Compression Storage Adapter".

*Stac Electronics Patent Pending*, "9703 Data Compression Coprocessor", PRS0003 Revision 1.01 (May 1990).

*IEEE Transactions on Communications*, "Better OPM/L Text Compression", T. C. T. C. Bell, vol. COM–34, No. 12, Dec. 1986, pp. 1176–1182.

*The Australian Computer Journal*, "A Linear Algorithm for Data Compression", R. P. Brent, vol. 19, No. 2, May 1987, pp. 64–68. 926–951.

*Communications of the ACM*, "Data Compression with Finite Windows", E. R. Fiala et al, Apr. 1989, vol. 32, No. 4, pp. 490–505.

*IEEE Transactions on Information Theory*, "On the Complexity of Finite Sequences", A Lempel and J. Ziv, vol, IT–22, No. 1, Jan. 1976, pp. 75–81.

*Quarter–Inch Cartridge Drive Standards, Inc. Development Standard*, "Data Compression Format for 1/4–inch Data Cartridge Tape Drivers", QIC–122, Revision A, Oct. 18, 1989.

*IBM Publication*, "Journal of Research and Development", Nov. 1988, vol. No. 32, 6, pp. 717–795.

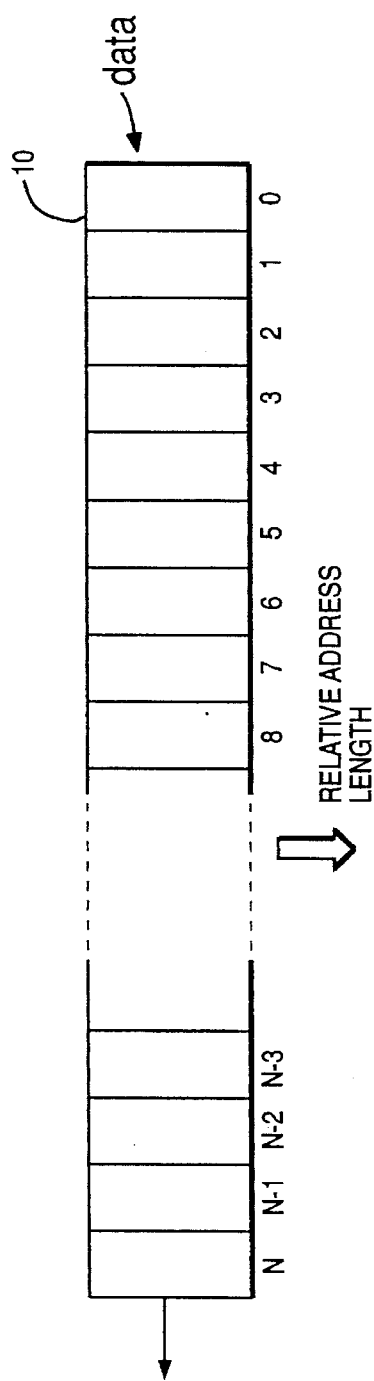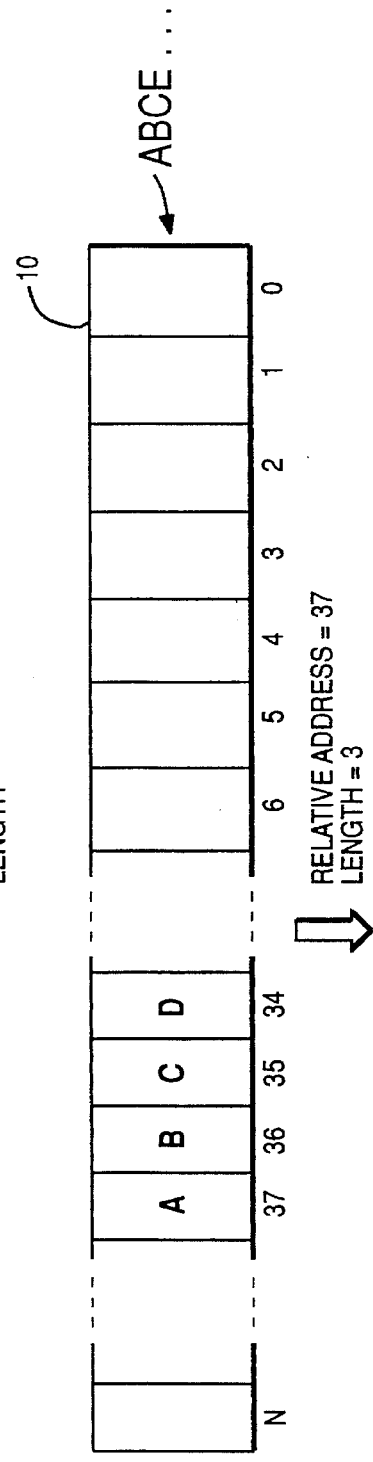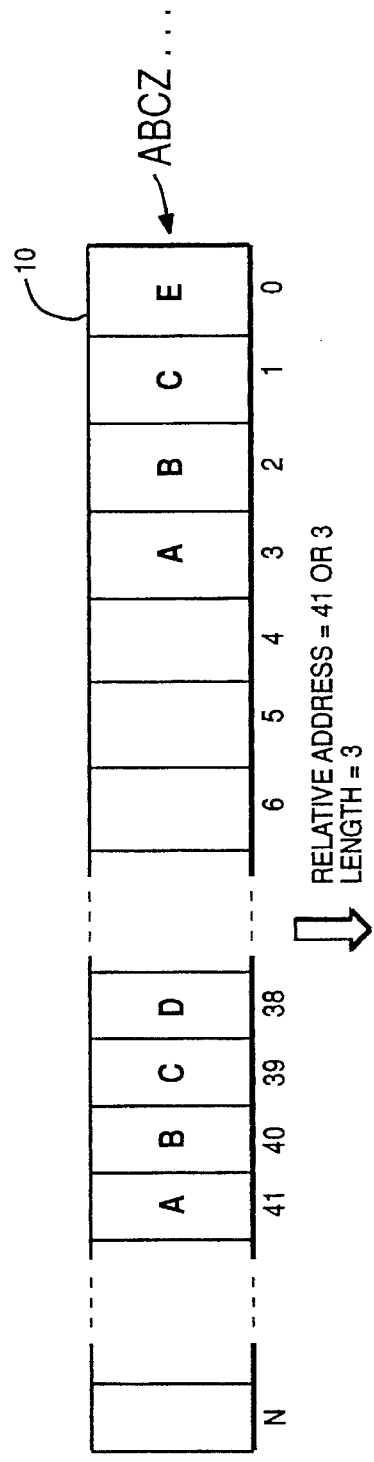

METHOD AND APPARATUS FOR COMPRESSING DATA

TECHNICAL FIELD

The present invention is directed to a method and apparatus for compressing and decompressing data and more specifically to sequential data compression and decompression.

BACKGROUND ART

Many types of data compression systems exist. One commonly used technique is the Lempel-Ziv algorithm which is described in "Compression of Individual Sequences via variable Rate Coding" by Lempel and Ziv in IEEE Transactions on Information Theory, September, 1977, pages 530–536. FIGS. 1A–1C illustrate a typical implementation of the Lempel-Ziv algorithm. In FIG. 1A, a shift register 10 that is N+1 bytes long is used to temporarily store previously processed data. If new data to be processed includes a string of data bytes that have been processed before, then a token including the length and relative address of the previously processed data string in the shift register will be generated. This can in general be expressed using fewer bits of information than the data string itself, so the data string is effectively compressed. If the data to be processed does not form part of a previous data string existing in the shift register, then a token or tokens will be generated containing this data explicitly. In general, such tokens have to be expressed using slightly more bits of information than the data itself, so there is an effective expansion. Overall, the gain from the compressed data strings usually exceeds the losses from the non-compressed data strings, so overall data compression results. If there are no repeating strings of data in a data stream, then the data stream can not be compressed by this technique.

FIG. 1B illustrates the generation of a token referencing previously processed data. In the example given, the values A, B, C and D were previously processed and are currently stored in the shift register at addresses 37, 36, 35 and 34. New values to be processed are A, B, C and E. The new data includes the string ABC that has a length of 3 and matches previously stored string ABC at relative address 37. The address is relative because once a token is generated describing the string, the values A, B, and C will be loaded into the shift register and the values A, B, C and D will be shifted down the shift register to a new address. The address of data in the shift register is relative to the number of data values subsequently processed.

FIG. 1C illustrates the generation of a second token referencing previously stored data. In the example given, the values A, B, C and Q are to be processed. The new data includes the string ABC that has a length of 3 and matches previously stored string ABC at relative addresses 3 and 41. The token generated in this example is usually the lower relative address of 3. Tokens include the count and relative address of the previously processed string and are expressed as (count, relative address). As a result of the compression of the values A, B, C, E, A, B, C and Z as shown in FIGS. 1B and 1C, the generated processed output will include: (3, 37), E, (3, 3), Z.

One of the primary problems with implementations of the Lempel-Ziv compression technique is the difficulty in performing the search operation for previous matching strings at an effective processing speed. Many techniques discussed below are modifications of the Lempel-Ziv technique that attempt to improve the speed of the technique by improving the speed of the search operation or the amount of compression achieved by using more efficient token encoding.

U.S. Pat. No. 4,558,302 teaches what is commonly called a Lempel-Ziv-Welch data compression technique. This patent discloses utilizing a dictionary for storing commonly used data strings and searching that dictionary using hashing techniques.

U.S. Pat. No. 4,876,541 is directed to improvements to the Lempel-Ziv-Welch data compression technique described above by using a matching algorithm.

U.S. patent application Ser. No. 07/807,007, filed Dec. 13, 1991, entitled "METHOD AND APPARATUS FOR COMPRESSING DATA", assigned to International Business Machines Corporation, teaches a modification to the Lempel-Ziv compression technique where the history buffer data is stored in a fixed location rather than a shift register. As a result, the tokens used to refer to previously compressed data refer to data in a fixed location rather than to data moving along a shift register.

SUMMARY OF THE INVENTION

The present invention includes an apparatus for compressing data including apparatus for using a received data element as an address to a location in a memory, an apparatus for determining whether the addressed memory location contains a first record of a first matching data element, and an apparatus for generating a pointer to the first matching data element. In addition, the present invention includes a method for compressing data including the steps of using a received data element as an address to a location in a memory, determining whether the addressed memory location contains a first record of a first matching data element, and generating a pointer to the first matching data element.

A further understanding of the nature and advantages of the present invention may be realized by reference to the remaining portions of the specification and drawing.

BRIEF DESCRIPTION OF THE DRAWINGS

FIGS. 1A–1C are diagrams of a prior art technique for compressing data;

BEST MODE FOR CARRYING OUT THE INVENTION

A major difficulty with implementations of Lempel-Ziv data compression techniques is the use of a relative addressing scheme. Such a scheme requires the use of a shift register to hold previously processed data words, one word in each data element. Each incoming data word is shifted into the first position of the shift register while all the previously processed data words are shifted into adjacent positions. In addition, a random access capability is required to each element of the shift register. This requires much more circuitry, chip area, and power to implement than a simple random access memory.

Another major difficulty with implementations of Lempel-Ziv data compression techniques is the storage and/or movement of historical data that is subsequently searched for providing tokens that refer to the historical data.

The present invention uses a history buffer that does not store the actual historical data to be searched, but rather uses input data as addresses to shift registers with each shift register storing bits whose location indicates when historical data matching the address of the shift register was previously encountered. This significantly decreases the search overhead requirements for each word operation while performing an exhaustive string matching process. This improves the compression ratio, as well as allowing very fast throughput.

Figure 2:
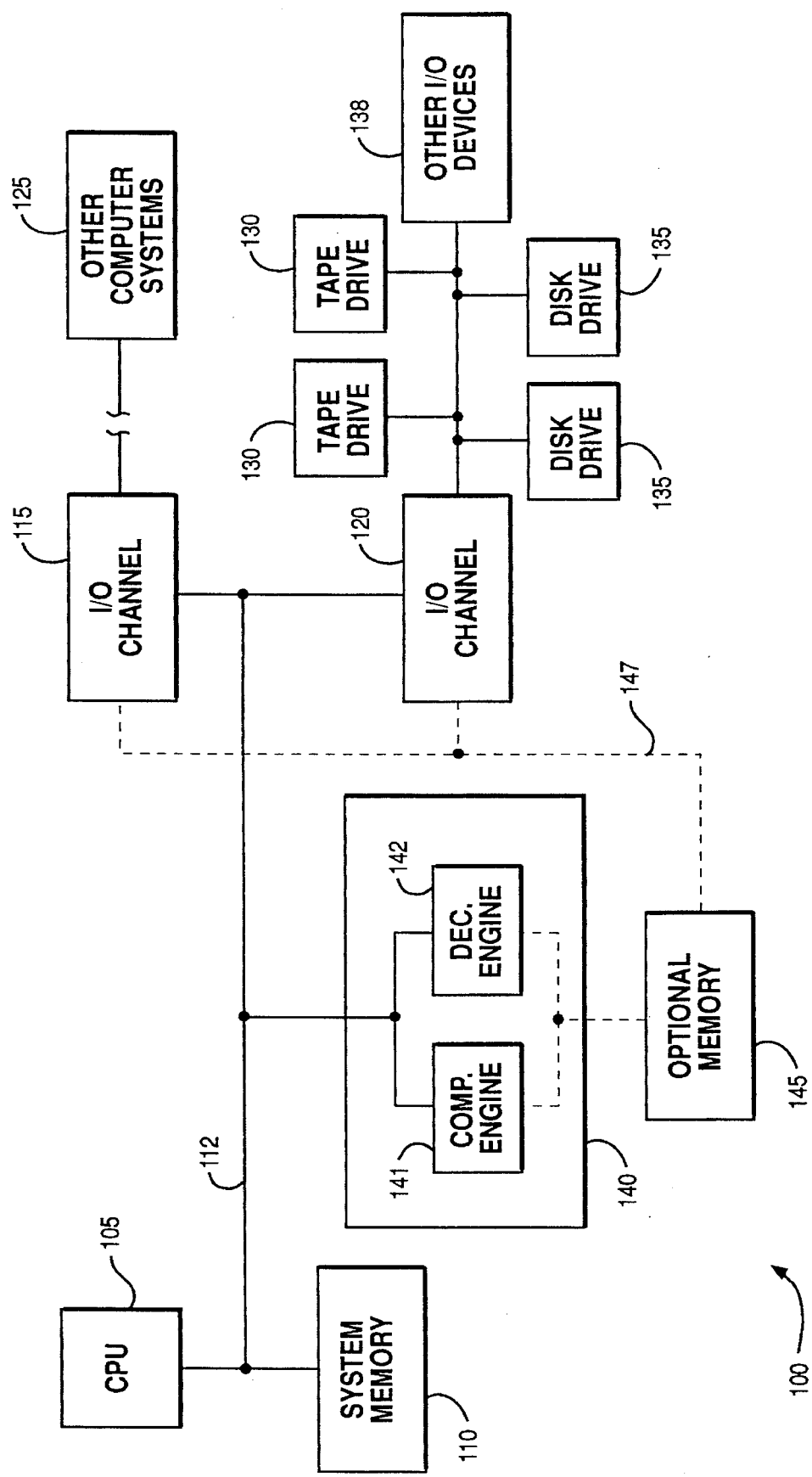
FIGS. 2 and 3 are illustrations of various system configurations utilizing a preferred embodiment of the invention.
Figure 3:
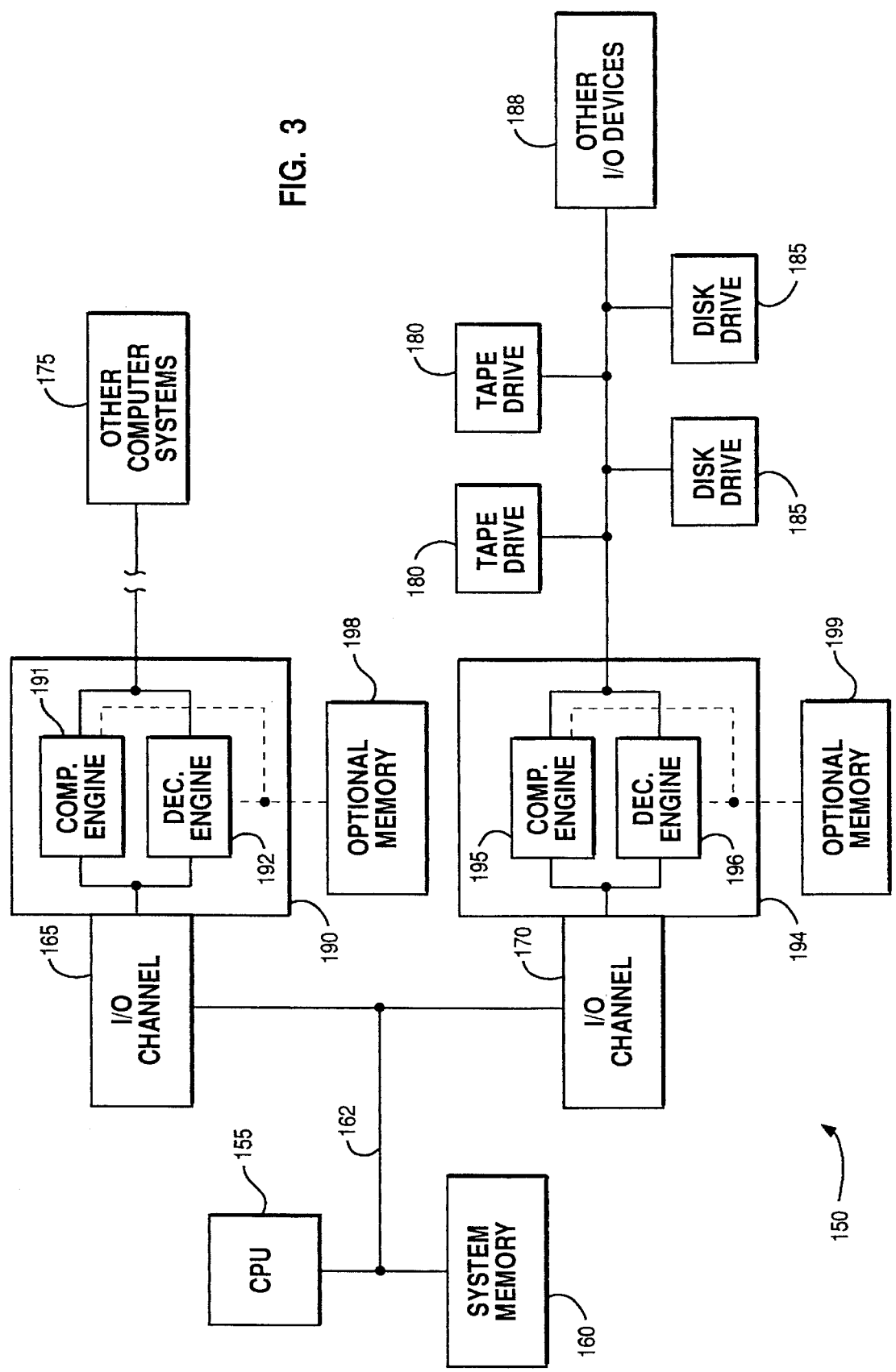

FIGS. 2 and 3 are illustrations of various system configurations utilizing a preferred embodiment of the invention. As shown in FIG. 2, a computer 100 includes a central processing unit (CPU) 105 that communicates with system memory 110. The CPU may be multiple processors connected in parallel, pipelined, or some combination thereof. The CPU also communicates on bus 112 with input/output channels or adapters 115 and 120. Through the input/output channels, the CPU may communicate with other computer systems 125, tape drives 130, disk drives 135, or other input/output devices 138 such as optical disks or removable floppy disks. System memory 110, tape drives 130, disk drives 135, removable media, etc. are all referred to as memory for storing data to be processed. In the preferred embodiment, a data compression apparatus or engine is a software implementation permanently stored on a disk drive 135, loaded in system memory 110, and executed by CPU 105 when needed. In an alternative embodiment, computer 100 may also include a hardware or software compression apparatus 140 on bus 112 that contains compression engine 141 and possibly a decompression engine 142. This compression engine may be invoked by an operating system file handler running on the CPU to do compression of data being transmitted or received through the input/output channels. The compression engine may utilize system memory 110 or an optional memory 145 while performing the desired compression of data. If optional memory 145 is used, the compressed data may be transmitted directly to and from the I/O channels on optional bus 147.

FIG. 3 illustrates a computer 150 including a CPU 155 and system memory 160. The CPU communicates on bus 162 with input/output channels or adapters 165 and 170. Through the input/output channels, the CPU may communicate with other computer systems 175, tape drives 180, disk drives 185 or other input/output devices 188. Coupled to the input/output channels are compression apparatus 190 and 194 including hardware or software compression engines 191 and 195 and possibly decompression engines 192 and 196 for compressing and/or decompressing some or all data passing through the input/output channels. The engine may also have optional memory 198 for working as buffers and for handling space management tasks as the data is compressed.

There are many other alternative system configurations utilizing a preferred embodiment of the invention that are apparent to those of ordinary skill in the art. For example, one computer system, such as a server, may include a data compression engine for compressing all data sent to it while the remaining computer systems may each include a decompression engine to decompress all data they receive from the server.

Figure 4:
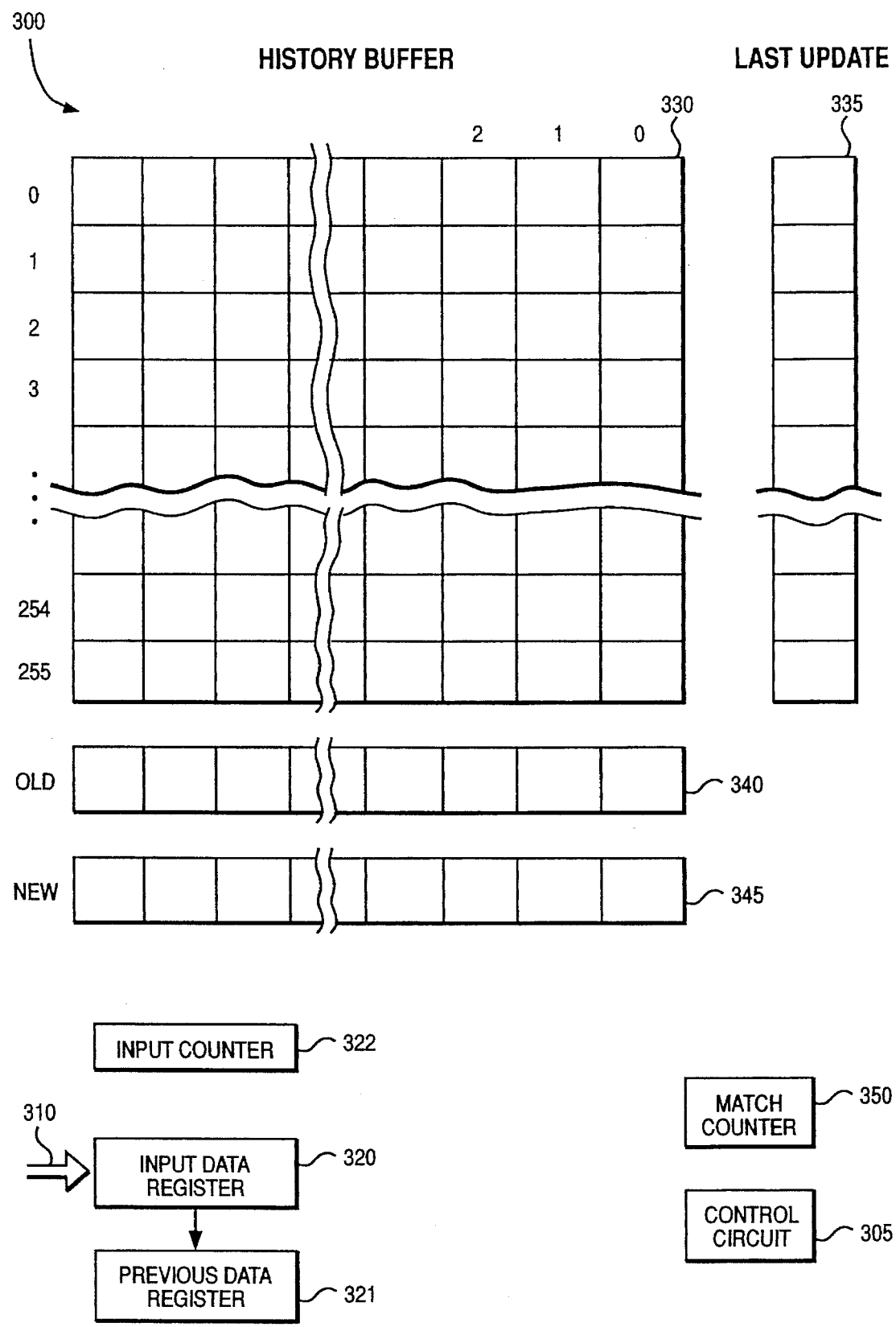
FIG. 4 is a block diagram illustrating a preferred data compression apparatus.

FIG. 4 is a block diagram illustrating a preferred data compression engine 300. In the preferred embodiment, the data compression engine is a software implementation which emulates the various elements described below. In an alternative embodiment, the data compression engine may easily be implemented in hardware. The operation of the various elements of the data compression engine are controlled by a control circuit 305 which is coupled to each of the elements described below. The control circuit is a logic circuit which operates as a state machine as will be described in greater detail below. Data enters the compression engine on input data bus 310 into input data register 320 and is later stored in a previous data buffer 321. In the preferred embodiment, the input data is an eight bit character. An input counter 322 is used to count the total number of input characters received. The eight bit data stored in the input data buffer is then used as an address to address history buffer 330 by control circuitry 305. The history buffer includes 256 shift registers, each shift register addressable by using the input data in the input data register. In the present example, each shift register contains 512 entries or cells (or some other number, typically two to the Nth power) which indicate when the addressing data for that shift register was previously received and stored in the input data register. That is, a 1 is stored in locations corresponding to when the addressing data for the shift register was previously received and stored in the input data register and a 0 is stored in locations corresponding to when data other than the addressing data for the shift register was previously received and stored in the input data register. In the preferred embodiment, a last update table 335 has 256 cells, each cell corresponding to one shift register, each cell including the time when each shift register was last updated. This allows any history buffer shift register to be updated only when input data is received that addresses that particular shift register. In an alternative embodiment, the last update table may not be used. However, in that case, all the shift registers in the history buffer will need to be shifted one bit after each input character.

An OLD register 340 and a NEW register 345 each includes 512 cells in the present example, each cell corresponding to one cell in each history buffer shift register. The OLD and NEW registers are used to locate matching strings of data as will be described below with reference to FIG. 5. A match counter 350 is used to count the number of input data characters matching a previous string of historical data.

Figure 5A:
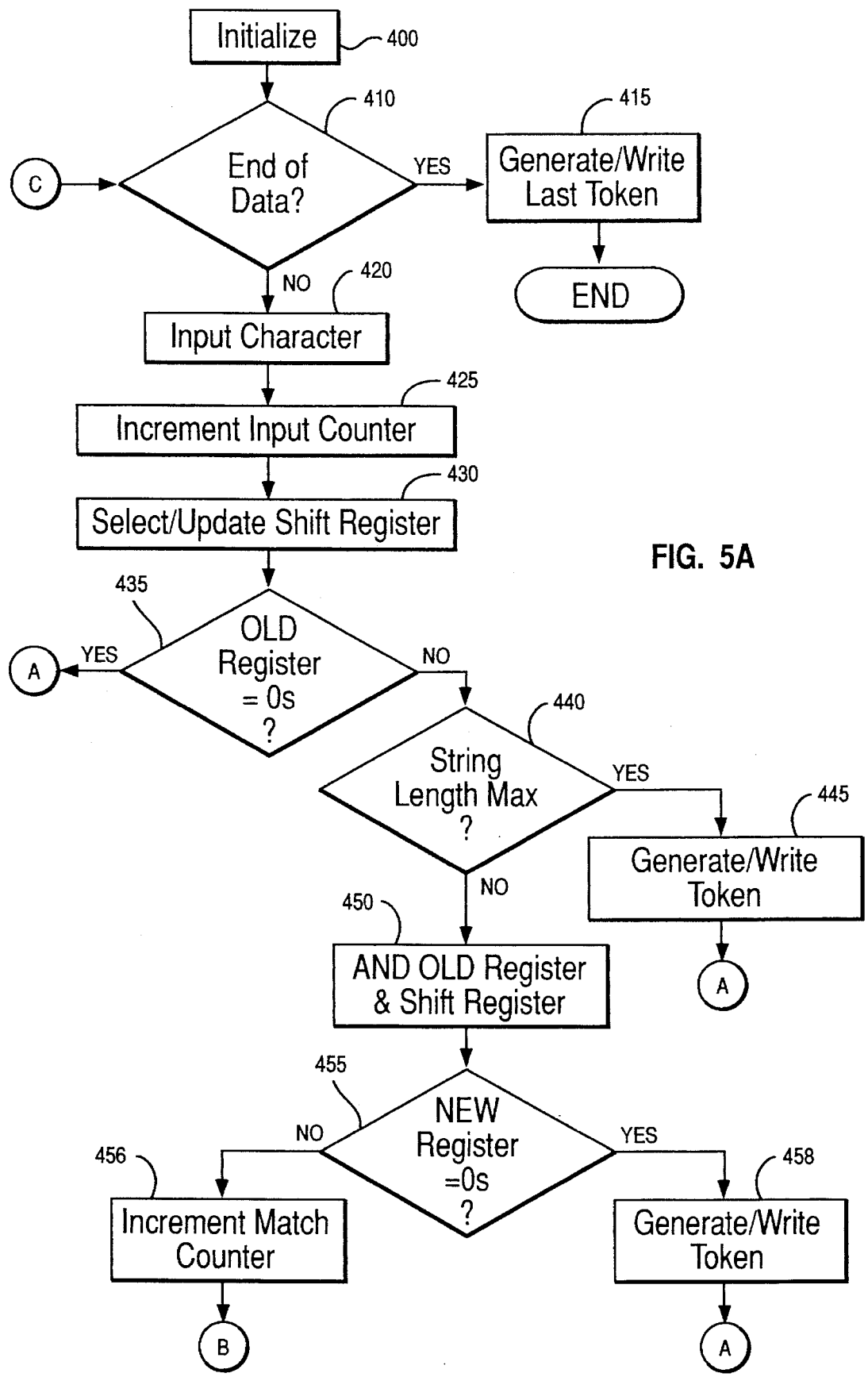
FIG. 5A–5B are flowcharts illustrating operation of the preferred embodiment of the invention utilizing the structure described in FIG. 4.
Figure 5B:
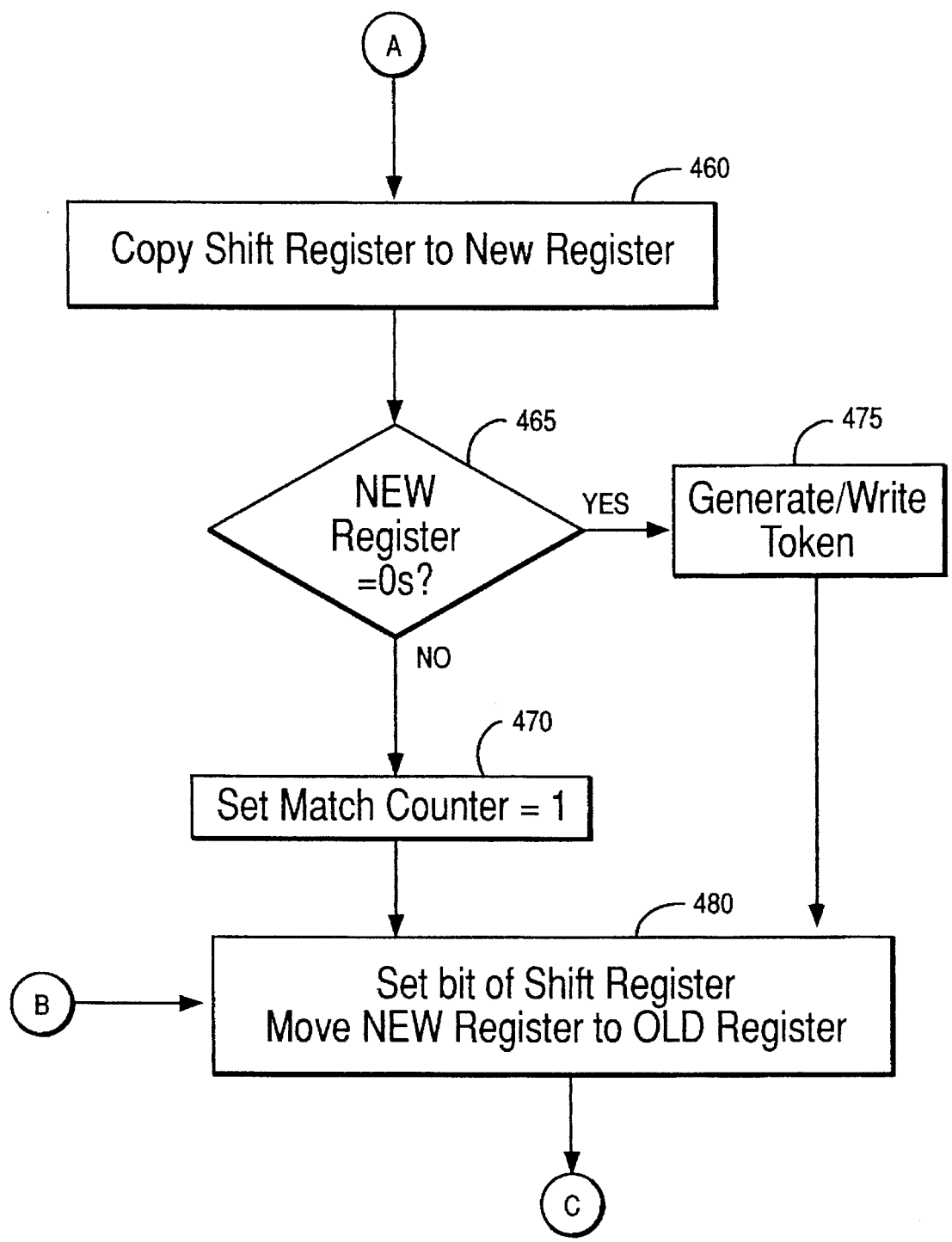

FIGS. 5A–5B are flowcharts illustrating operation of the preferred embodiment of the invention utilizing the structure described in FIG. 4 above. In a first step 400, the data compression engine is initialized. In the preferred embodiment, the last update table 335 is loaded with a negative value greater than the length of the shift registers, the input counter 322 is set to negative one (−1), the OLD and NEW registers 340 and 345 and the match counter 350 are set to zero (0). This is to prevent the compression engine from utilizing random data currently stored in the history buffer for matching strings. In an alternative embodiment, the last update table 335 may be loaded with negative ones (−1) and the history buffer loaded with zeroes to accomplish initialization. In another alternative embodiment, the last update table, history buffer, input counter, OLD and NEW registers, and match counter may be preloaded with a desired or previously used history, such as one that is optimized for a particular set or sets of data. In cases where the compression engine may be interrupted with other compression tasks, the last update table, history buffer, input counter, OLD and NEW registers, and match counter contents may be stored to memory for later use when the data compression is continued (i.e. context switching).

In step 410, it is determined whether there is any more input data to be received. If not, then processing continues to step 415 to generate the last data token, a process that will be described in greater detail below in step 458. If yes, then in step 420, the character currently in the input data register 320 is loaded into previous data register 321 and the next character of input data is read and loaded into input data register 320. In step 425, the input counter 322 is incremented by one to indicate that another input character has been received.

In step 430, a shift register in the history buffer and a corresponding cell in the last update table are selected by using the input value in the input data register as an address. The difference of the input counter value and the value in the selected cell of the last update table is used as a shift count to shift left with zero fill the selected shift register. This is to update the selected shift register to the current time. For example, if the selected shift register has not been updated for 512 cycles in the present example, then the selected shift register will be filled with all zeroes to indicate that lack of a match during the past 512 cycles.

In step 435, it is determined whether the OLD register is all zeroes indicating that no string match is currently in progress. If yes, then processing continues to step 460 described below. If no, then processing continues to step 440 where it is determined whether a maximum length data string match has occurred. That is, data string matches should not exceed, in the preferred embodiment, a maximum length that can be encoded in an output data token. If yes, then in step 445, calculate the starting point, known as displacement, of the matching string using the value in the OLD register (i.e. the location of any ones in the OLD register) and generate and write a token referring to a previous matching string of characters. In the preferred embodiment, a token referring to a matching previous string of characters starts with a first bit equal to 1 (as opposed to a first bit equal to 0 for a raw or non-matching token) followed by the displacement and length of the matching string. Processing then continues to step 460 described below. If, in step 440, the result was no, then processing continues to step 450.

In step 450, the contents of the OLD register are ANDed with the selected shift register and the result is stored in the NEW register. In the preferred embodiment, the OLD register and the shift register include 16 thirty-two bit words for a total of 512 bits. During step 430 above, an index may be generated indicating which words in the shift register contain at least a single one. In addition, during steps 460 and 480 below, a similar index may be constructed or copied from the shift register for the NEW and then the OLD registers. These indices may be used to limit the AND operation to where there are some ones in corresponding words in both the shift register and the OLD register. In step 455, it is determined whether the NEW register is all zeroes indicating that the current input character does not continue a matching string of data. If no, then, in step 456, the match counter 350 is incremented by 1 and processing continues to step 480 described below.

If the answer to step 455 is yes, indicating that a previously matching string is discontinued with the current input character, then processing continues to step 458. In step 458, a token is calculated, generated and written to output. If the value in match counter 450 is one, this indicates that the input data stored in the previous data register 321 started a matching string that did not continue with the data character stored in the input data register. If so, then a raw token is generated as described that starts with a first bit equal to zero followed by the input character (8 bits in the present example) located in the previous data register. Otherwise, a compressed data token is generated as described in step 445 above that includes the displacement and length of the matching string. Processing then continues to step 460.

In step 460, copy the contents of the selected shift register to the NEW register. In step 465, it is determined whether the contents of the NEW register is all zeroes, indicating whether the data character in the input data register has been received before during the past 512 cycles. If no, then in step 470 the match counter is set to one indicating the start of a new matching string and processing continues to step 480 described below. If yes in step 465, then processing continues to step 475. In step 475, the data in the input data register is encoded as a raw data token. In step 480, the right most bit of the selected shift register is set to 1 indicating the receipt of the input data in the input data register. In addition, the contents of the NEW register is moved to the OLD register. In the preferred embodiment, this may be easily performed by using an OLD register pointer that will alternately point to the two registers used as the OLD and NEW registers such that the NEW register becomes the OLD register and vice versa for each input character. As a result, the actual data in the NEW register does not have to be moved to the OLD register. Instead the pointer to the OLD register is pointed to the previous NEW register. Processing then returns to step 410.

Figure 6A:
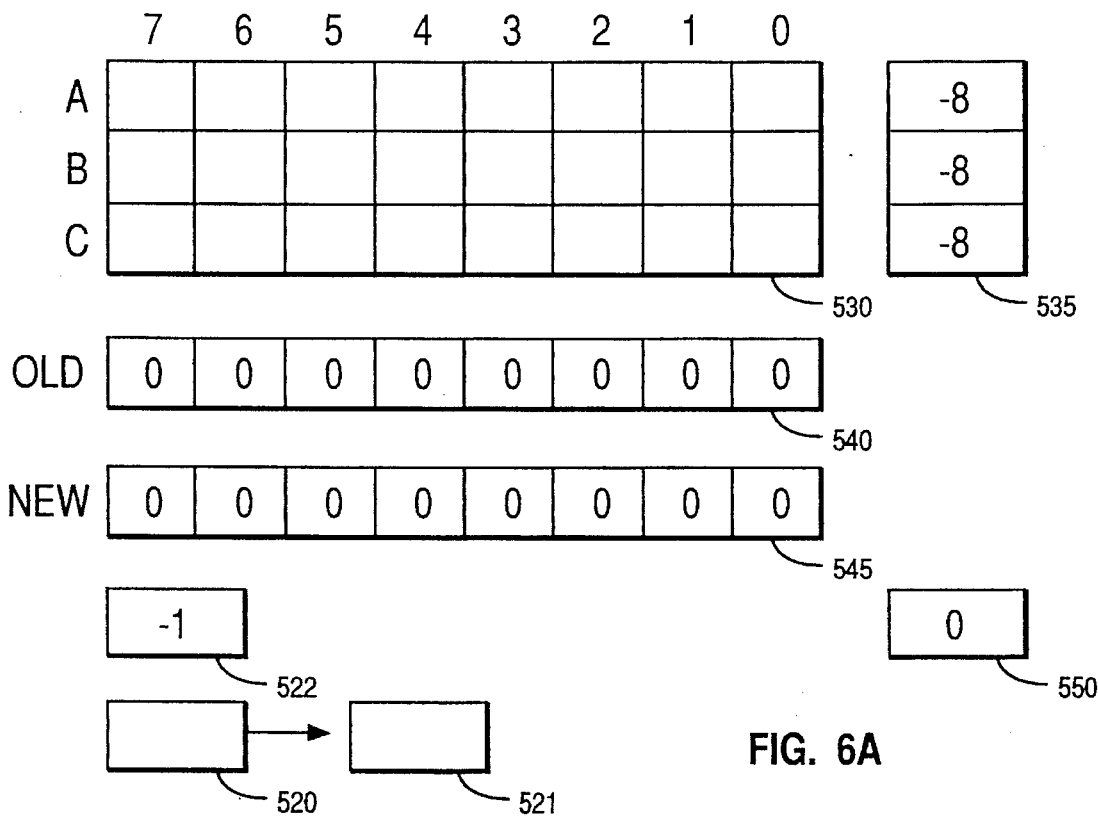
FIGS. 6A–6F are block diagrams illustrating an example input data stream being compressed using the structure illustrated in FIG. 4.

FIGS. 6A–6F are block diagrams illustrating an example input data stream being compressed using the structure illustrated in FIG. 4 above. In the present example, the history buffer is eight bits wide with three possible entries, A, B and C. The input data stream is [A B A B C]. FIG. 6A illustrates the various elements of the compression engine after the engine is initialized. A history buffer 530 is left with random numbers while the last update table is set to all −8 (negative the number of entries in each shift register of the history buffer). The OLD and NEW registers 540 and 545 and the match counter 550 are set to 0. The input counter 522 is set to −1. The input data register and previous data registers 520 and 521 are left with random numbers as no data has been received yet.

Figure 6B:
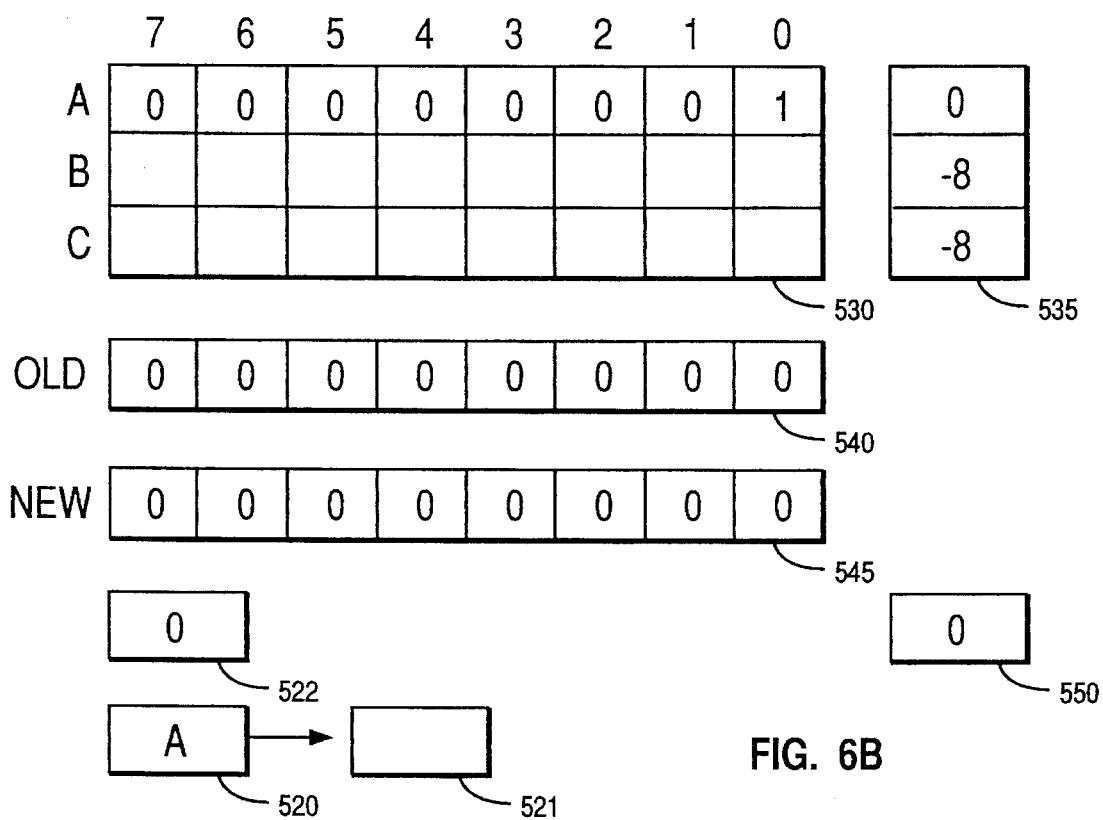

FIG. 6B illustrates the various elements of the compression engine after the first character A has been received. The input counter has been incremented and the shift register for A has been updated. The OLD register indicates that no match has occurred yet. A raw token was generated that read as (0,A).

Figure 6C:
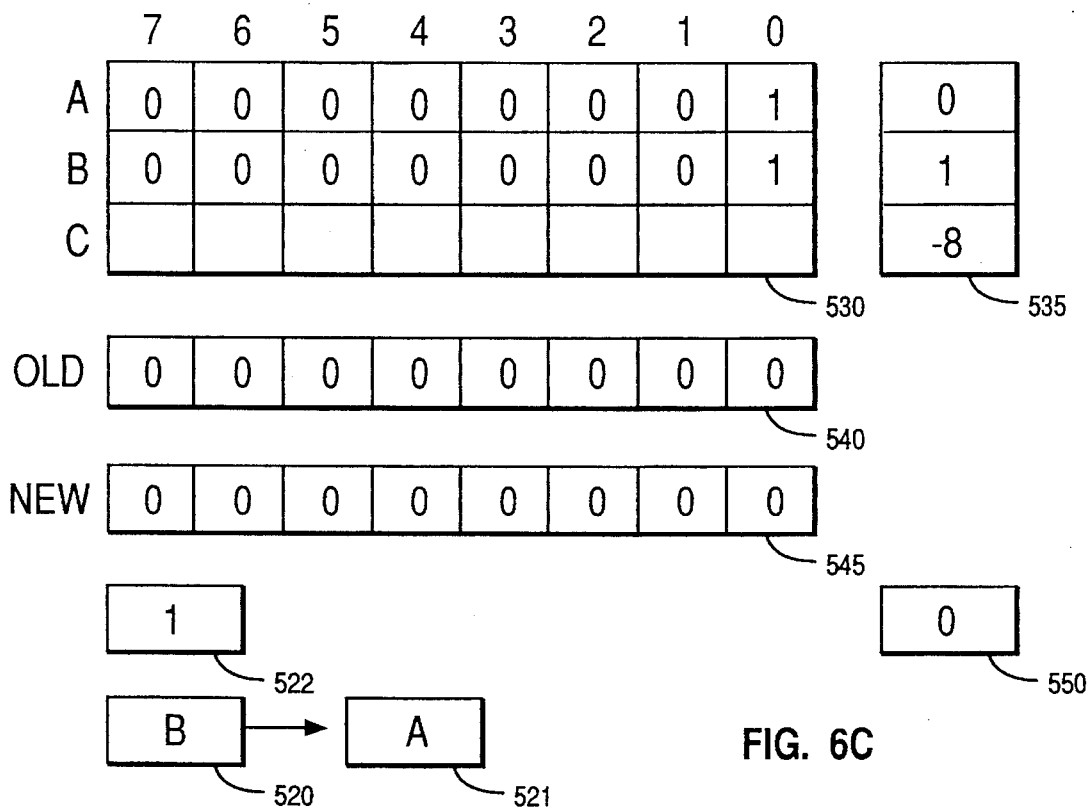

FIG. 6C illustrates the various elements of the compression engine after the second character B has been received. The input counter has been incremented and the shift register for B has been updated. The OLD register indicates that no match has occurred yet. A raw token was generated that read as (0,B).

Figure 6D:
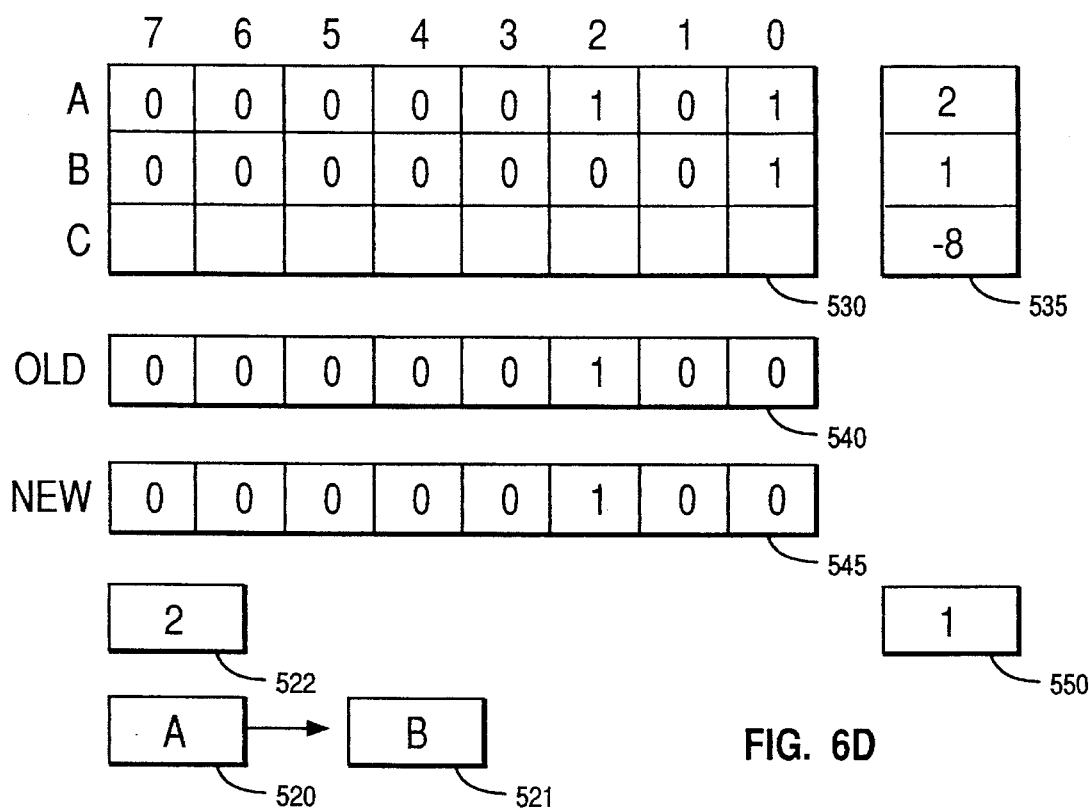

FIG. 6D illustrates the various elements of the compression engine after the third character A has been received. The input counter has been incremented and the shift register for A has been updated. The OLD register and the match counter indicate that a match has occurred. No tokens were generated.

Figure 6E:
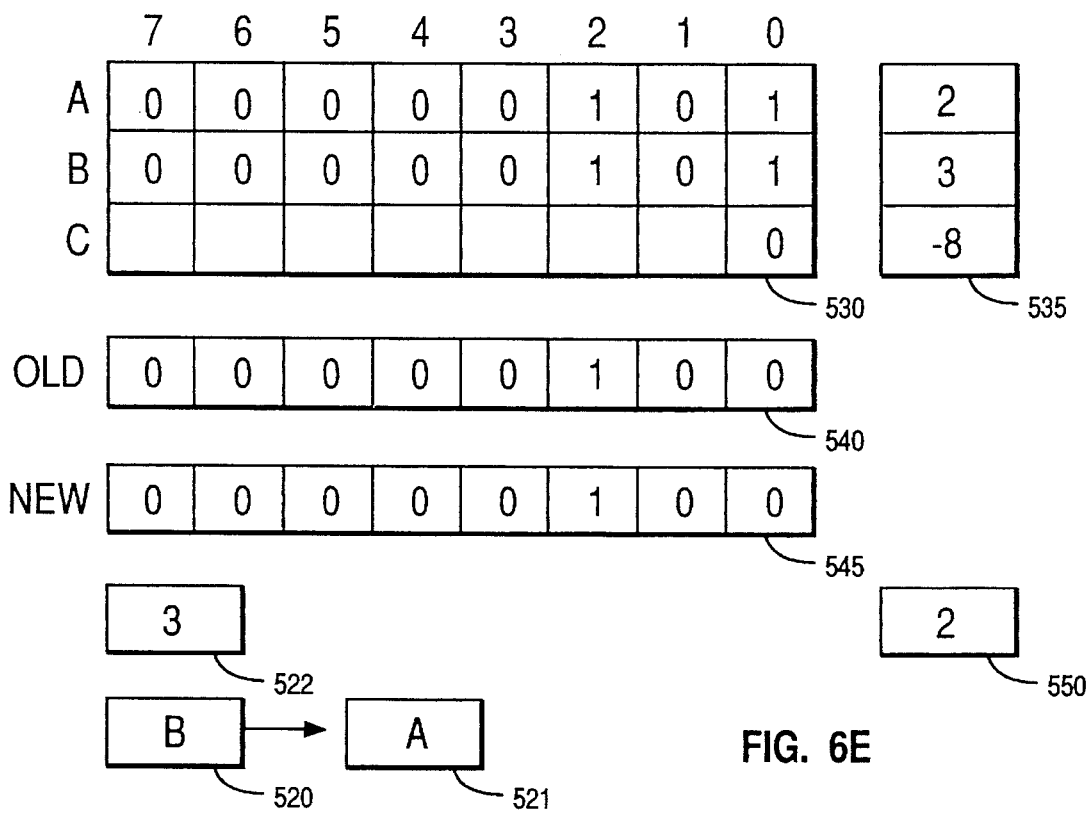

FIG. 6E illustrates the various elements of the compression engine after the fourth character B has been received. The input counter has been incremented and the shift register for B has been updated. The OLD register and the match counter indicate that a match is continuing. No tokens were generated.

Figure 6F:
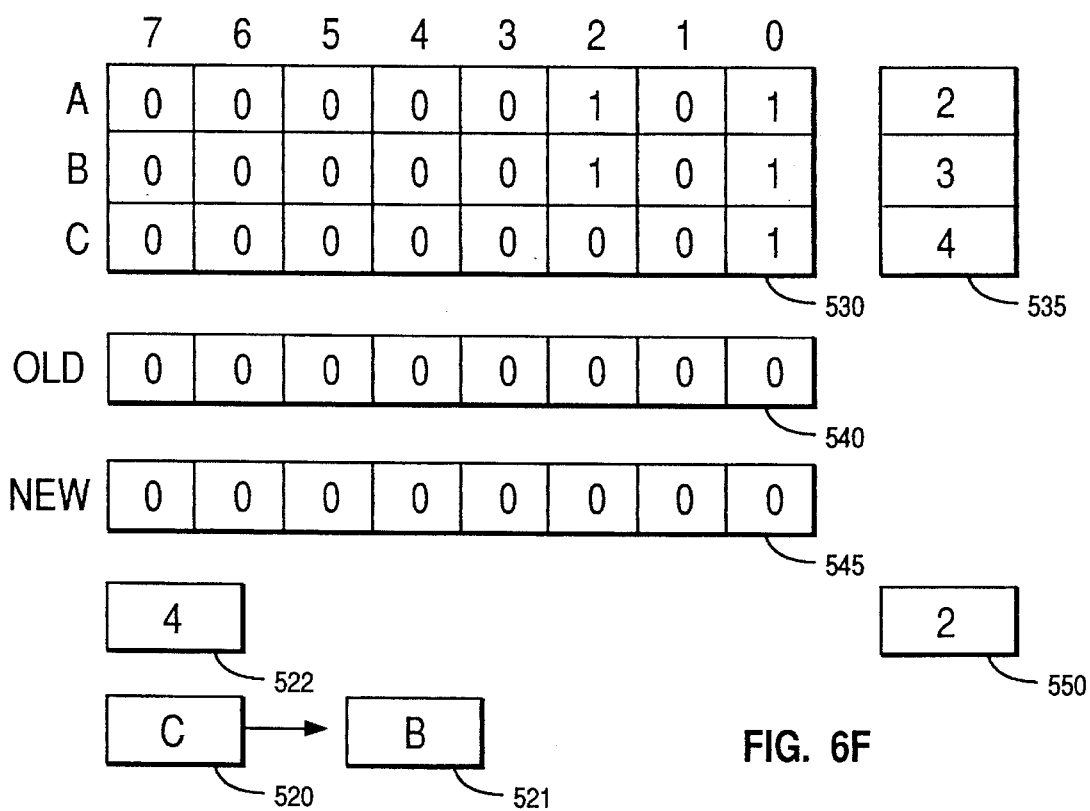

FIG. 6F illustrates the various elements of the compression engine after the fifth character C has been received. The input counter has been incremented and the shift register for C has been updated. The OLD register indicates that no match is occurring. A compressed word token was generated that read as (1, 0, 2) referencing the previous matching string of A and B starting at time 0 with length 2. Due to C being the last input character, a raw token was also generated that read as (0,C)

As a result of this example, [A B A B C] is encoded as [(0,A) (0,B) (1,0,2) (0,C)].

An optional unit may be included in an alternative embodiment of the invention to allow the compression engine to compress data to typical Lempel-Ziv form that utilizes relational addresses as described in FIGS. 1A–1C. An addition circuit would be used to convert the fixed address to a relational address by adding the value in the match counter from the relational address. The addition circuit could also be included but disabled when compressing data in a fixed address format In the preferred embodiment, a raw word token is generated as a 0 followed by the raw word. A compressed word token is passed as a 1 followed by the length of the matching string and the starting location of the matching string in the CAM array (called the displacement). A control token may also be generated which starts with eight 1's and is followed with four bits designating the control instructions. Finally, an end token is passed to designate the end of a compressed data stream. The end token is thirteen 1's in a row.

Table 1 shows the codes used in the preferred embodiment to designate the length of a compressed data word string. This type of coding is a modified logarithmic coding wherein shorter strings utilize shorter codes and longer strings utilize longer codes. This is a useful coding technique when the frequency of shorter strings is substantially greater than the frequency of longer strings. The displacement is specified with an 11 bit value in the preferred embodiment. A shorter displacement may be used with a CAM array having fewer sections.

TABLE 1

| Codes Used to Designate Compressed Word Length | |
|---|---|
| Code Field | Compressed Word Length |
| 00 | 2 words |
| 01 | 3 words |
| 10 00 | 4 words |
| 10 01 | 5 words |
| 10 10 | 6 words |
| 10 11 | 7 words |
| 110 000 | 8 words |
| ...... | ...... |
| ...... | ...... |
| 110 111 | 15 words |
| 1110 0000 | 16 words |
| ...... | ...... |
| ...... | ...... |
| 1110 1111 | 31 words |
| 1111 0000 0000 | 32 words |
| ...... | ...... |
| ...... | ...... |
| 1111 1110 1111 | 271 words |

In order to provide for future expansion of the invention, control instructions may be passed in the compressed data stream. These control instructions may include instructions such as reset the history buffer, preload the history buffer with a preferred data set, etc. In the preferred embodiment, there are two types of control instructions, long and short. Table 2 illustrates long control instructions wherein a 12 bit control field is given followed by an 11 bit control subfield. This provides for 2048 subfields for each of the four control fields for a total of 8208 possible long instructions.

TABLE 2

| Long Instruction Control Fiels and Subfields | |
|---|---|
| Long Control Field | Control Subfield |
| 1111 1111 0000 | 0000 0000 000 - 1111 1111 111 |
| 1111 1111 0001 | 0000 0000 000 - 1111 1111 111 |
| 1111 1111 0010 | 0000 0000 000 - 1111 1111 111 |
| 1111 1111 0011 | 0000 0000 000 - 1111 1111 111 |

Table 3 illustrates the short control instructions. The short control instructions are only 12 bits long and are, therefore, fewer in number than the total number of long control instruction. However, the short control instructions require less time to transmit. As described above, one short control field has already been defined as an end marker. The end marker is a 1 (defining the following bits as being either a compressed data token or as a control instruction) followed by the twelve bit end marker control instruction (twelve 1s).

TABLE 3

| Short Instruction Control Fields | | | |
|---|---|---|---|
| Control Field | | | Current Function |
| 1111 | 1111 | 0100 | not defined |
| 1111 | 1111 | 0101 | not defined |
| 1111 | 1111 | 0110 | not defined |
| ... | ... | ... | ... |
| ... | ... | ... | ... |
| 1111 | 1111 | 1110 | not defined |
| 1111 | 1111 | 1111 | end marker |

The present invention uses a history buffer that does not store the actual historical data to be searched, but rather uses the historical data as addresses to shift registers with each shift register storing bits located where the historical data was previously encountered. This significantly decreases the search overhead requirements for each word operation while performing an exhaustive string matching process. As a result, the present invention performs compression more quickly and efficiently.

The present invention also provides for more effective compression than many existing Lempel-Ziv techniques because the search for matching data strings is exhaustive. That is, the history buffer allows for an exhaustive search for all possible matching strings. Many existing techniques use a compromising technique such as hashing in order to reduce the search time but which may not find the longest matching string in memory.

Although the present invention has been fully described above with reference to specific embodiments, other alternate embodiments may be apparent to those of ordinary skill in the art. For example, data words including multiple data bytes or partial data bytes may be sequentially compressed utilizing the apparatus and method described above. Therefore the above description should not be taken as limiting the scope of the present invention which is defined by the appended claim.

What is claimed is:

1. An apparatus for compressing data comprising:
   means for using a received data element as an address to a location in a memory;

means for determining whether the addressed memory location contains a first record of a first matching data element; and means for generating a pointer to the first matching data element.

2. The apparatus of claim 1 wherein the means for using a received data element further includes using a second received data element as a second address to a second location in the memory.

3. The apparatus of claim 2 wherein the means for determining includes determining whether the second addressed location of the memory includes a second record of a second matching data element contiguous to the first matching data element.

4. The apparatus of claim 3 wherein the means for generating includes generating a pointer to the first and second matching data elements.

5. The apparatus of claim 4 wherein the means for using a received data element as an address to a location in a memory includes using a received data element as an address to one of a plurality of shift registers.

6. A data processing system comprising:

a memory for storing data;

a processor for processing data;

means for using a received data element as an address to a location in the memory;

means for determining whether the addressed memory location contains a first record of a first matching data element; and means for generating a pointer to the first matching data element.

7. The data processing system of claim 6 wherein the means for using a received data element further includes using a second received data element as a second address to a second location in the memory.

8. The data processing system of claim 7 wherein the means for determining includes determining whether the second addressed location of the memory includes a second record of a second matching data element contiguous to the first matching data element.

9. The data processing system of claim 8 wherein the means for generating includes generating a pointer to the first and second matching data elements.

10. The data processing system of claim 9 wherein the means for using a received data element as an address to a location in a memory includes using a received data element as an address to one of a plurality of shift registers.

11. A method for compressing data comprising the steps of:

using a received data element as an address to a location in a memory;

determining whether the addressed memory location contains a first record of a first matching data element; and generating a pointer to the first matching data element.

12. The method of claim 11 wherein the step of using a received data element further includes using a second received data element as a second address to a second location in the memory.

13. The method of claim 12 wherein the step of determining includes determining whether the second addressed location of the memory includes a second record of a second matching data element contiguous to the first matching data element.

14. The method of claim 13 wherein the step of generating includes generating a pointer to the first and second matching data elements.

15. The method of claim 14 wherein the step of using a received data element as an address to a location in a memory includes using a received data element as an address to one of a plurality of shift registers.

16. A computer program product executable by a processor and stored in memory for compressing data comprising:

means for using a received data element as an address to a location in a memory;

means for determining whether the addressed memory location contains a first record of a first matching data element; and means for generating a pointer to the first matching data element.

17. The computer program product of claim 16 wherein the means for using a received data element further includes using a second received data element as a second address to a second location in the memory.

18. The computer program product of claim 17 wherein the means for determining includes determining whether the second addressed location of the memory includes a second record of a second matching data element contiguous to the first matching data element.

19. The computer program product of claim 18 wherein the means for generating includes generating a pointer to the first and second matching data elements.

20. The computer program product of claim 19 wherein the means for using a received data element as an address to a location in a memory includes using a received data element as an address to one of a plurality of shift registers.

* * * * *